(12) United States Patent
Yu et al.

(10) Patent No.: US 11,374,206 B2
(45) Date of Patent: Jun. 28, 2022

(54) DISPLAY PANEL, DISPLAY DEVICE, AND MANUFACTURING METHOD OF DISPLAY PANEL

(71) Applicant: Shanghai Tianma Micro-Electronics Co., Ltd., Shanghai (CN)

(72) Inventors: Quanpeng Yu, Shanghai (CN); Qing Zhang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 198 days.

(21) Appl. No.: 17/005,048

(22) Filed: Aug. 27, 2020

(65) Prior Publication Data

US 2021/0408501 A1    Dec. 30, 2021

(30) Foreign Application Priority Data

Jun. 30, 2020    (CN) .......................... 202010621679.1

(51) Int. Cl.
*H01L 51/52* (2006.01)
*H01L 51/56* (2006.01)
*H01L 27/32* (2006.01)

(52) U.S. Cl.
CPC .......... *H01L 51/5284* (2013.01); *H01L 51/56* (2013.01); *H01L 27/323* (2013.01); *H01L 2227/326* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 10,156,663 B2 * | 12/2018 | Jang | G02F 1/133308 |
| 2016/0223722 A1 * | 8/2016 | Ahn | G02B 5/3083 |
| 2016/0372701 A1 * | 12/2016 | Kwon | G02B 5/003 |
| 2020/0116899 A1 * | 4/2020 | Eo | G02B 1/14 |
| 2020/0161590 A1 * | 5/2020 | Seo | G06F 1/1652 |

\* cited by examiner

*Primary Examiner* — J. E. Schoenholtz
(74) *Attorney, Agent, or Firm* — Christensen O'Connor Johnson Kindness PLLC

(57) ABSTRACT

A display panel, a display device and a manufacturing method of the display panel are provided. The display panel has a display area and a non-display area surrounding the display area and includes a substrate, an array layer, a display layer, and an encapsulation layer that are arranged sequentially, and an ink layer located in the non-display area and surrounding the display area. The ink layer includes a first ink layer and a second ink layer that are located in different layers. Each of an orthographic projection of the first ink layer on the substrate and an orthographic projection of the second ink layer on the substrate is a non-closed pattern surrounding the display area.

20 Claims, 15 Drawing Sheets

DISPLAY PANEL, DISPLAY DEVICE, AND MANUFACTURING METHOD OF DISPLAY PANEL

CROSS-REFERENCE TO RELATED APPLICATIONS

The present application claims priority to Chinese Patent Application No. 202010621679.1, filed on Jun. 30, 2020, the content of which is incorporated herein by reference in its entirety.

TECHNICAL FIELD

The present disclosure relates to the field of display, in particular to a display panel, a display device and a manufacturing method of the display panel.

BACKGROUND

Flexible display panels are deformable and bendable display devices and are hotspots of research and development in the display technology, due to their advantages of convenient carrying, bendability and windability.

If a state of the flexible display panel changes, problems such as layer separation, cracks, disconnection, etc., may be caused, which affects the normal display of the flexible display panel and shortens the service life of the flexible display panel.

SUMMARY

In view of this, the present disclosure provides a display panel, a manufacturing method of the display panel, and a display device including the display panel.

The present disclosure provides a display panel having a display area and a non-display area surrounding the display area. The display panel includes a substrate, an array layer, a display layer, and an encapsulation layer arranged in that order, and the display panel further includes an ink layer located in the non-display area and surrounding the display area. The ink layer includes at least a first ink layer and a second ink layer located in different layers, an orthographic projection of the first ink layer on the substrate is a non-closed pattern surrounding the display area, and an orthographic projection of the second ink layer on the substrate is a non-closed pattern surrounding the display area.

The present disclosure further provides a manufacturing method of the display panel, including: arranging the substrate, the array layer, the display layer and the encapsulation layer in that order; and forming the ink layer by silk printing.

The present disclosure further provides a display device including the display panel.

DESCRIPTION OF EMBODIMENTS

Figure 1:
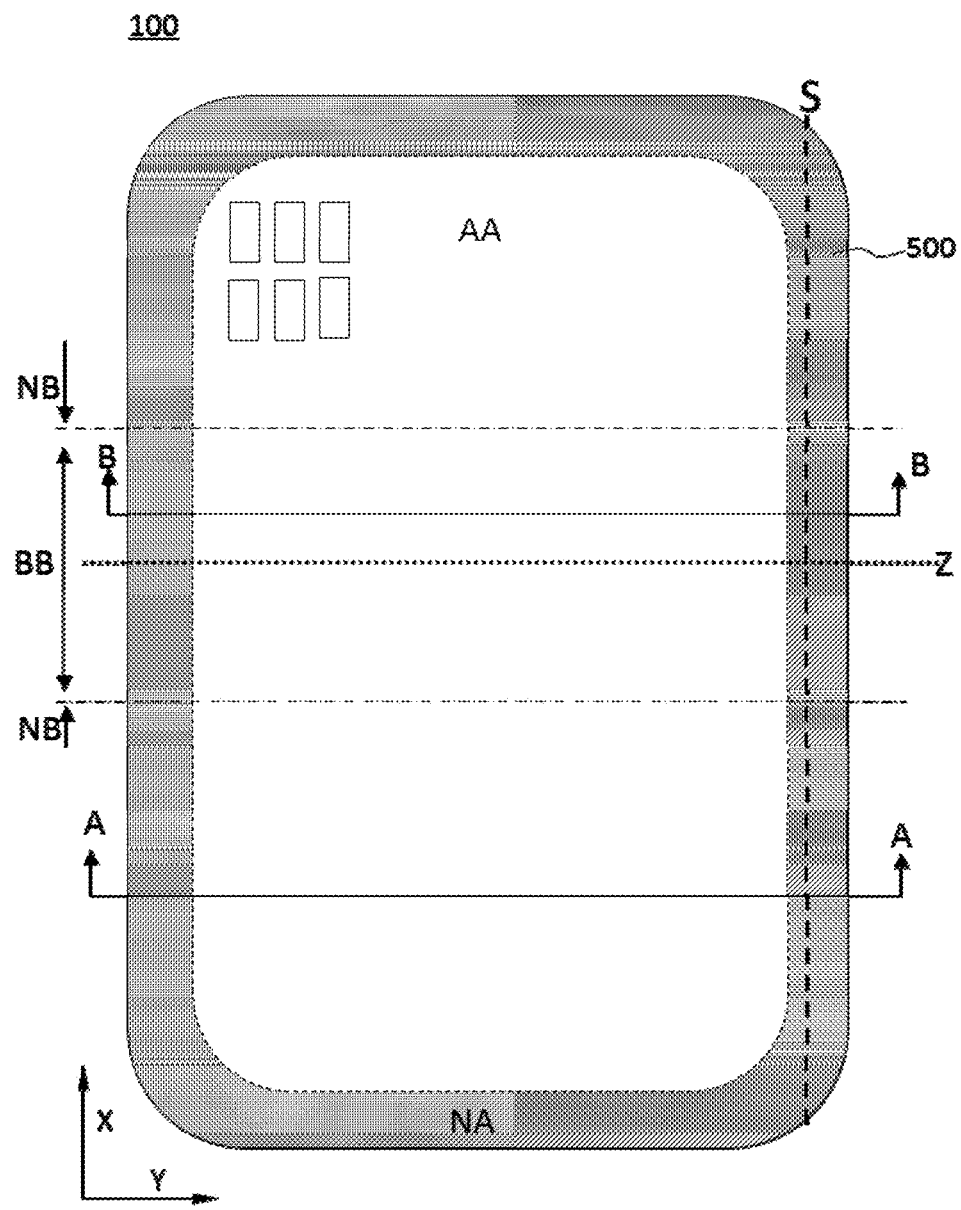
FIG. 1 is a top view of a display panel provided by an embodiment of the present disclosure.

In order to make the above-mentioned objects, features and advantages of the present disclosure clearer and more understandable, the present disclosure will be further described with reference to the accompanying drawings and embodiments.

It should be noted that specific details are set forth in the following description in order to fully understand the present disclosure. However, the present disclosure can be implemented in many other ways different from those described herein, and those skilled in the art can make similar generalizations without violating the connotation of the present disclosure. Therefore, the present disclosure is not limited to the specific embodiments disclosed below.

The terms used in the embodiments of the present disclosure are only for the purpose of describing specific embodiments, and are not intended to limit the present disclosure. The singular forms of "a", "said" and "the" used in the embodiments of the present disclosure and the appended claims are also intended to include plural forms, unless indicated otherwise.

It should be noted that the "up", "lower", "left", "right" and other directional terms described in the embodiments of the present disclosure are described from the angle shown in the drawings, and should not be construed as limitations to the embodiments of the present disclosure. In addition, in the context, it should also be understood that when it is mentioned that an element is formed "on" or "under" another element, it not only can be directly formed "on" or "under" another element, but also can be indirectly formed "on" or "under" another element through an intermediate element.

Moreover, the exemplary embodiments can be implemented in various forms, and should not be construed as being limited to the embodiments set forth herein; on the contrary, the provision of these embodiments makes the present disclosure more comprehensive and complete, and fully conveys the concept of the exemplary embodiments to those skilled in the art. The same reference numerals in the figures indicate the same or similar structures, and thus their repeated description will be omitted. The words expressing position and direction described in the present disclosure are all illustrated by taking the drawings as examples, but they can also be changed according to needs, and the changes are all included in the protection scope of the present disclosure. The drawings of the present disclosure are only used to illustrate the relative positional relationship, and the layer thicknesses of some parts are drawn in an exaggerated way to facilitate understanding, and the layer thicknesses in the drawings do not represent the proportional relationship of the actual layer thicknesses. In the case of no conflict, the embodiments of the present disclosure and the features in the embodiments can be combined with each other. The drawings of the embodiments in the present disclosure share the same reference numerals. In addition, the similarities between the embodiments will not be repeated herein.

Figure 2:
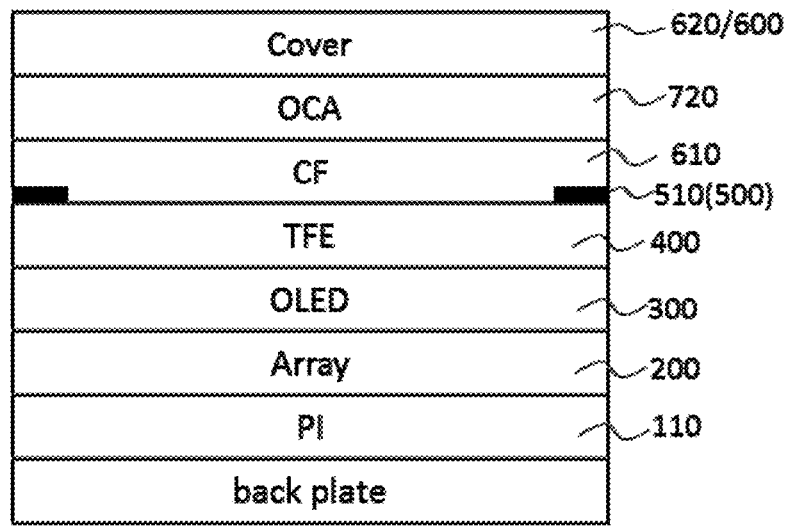
FIG. 2 is a cross-sectional view taken along line A-A shown in FIG. 1.
Figure 3:
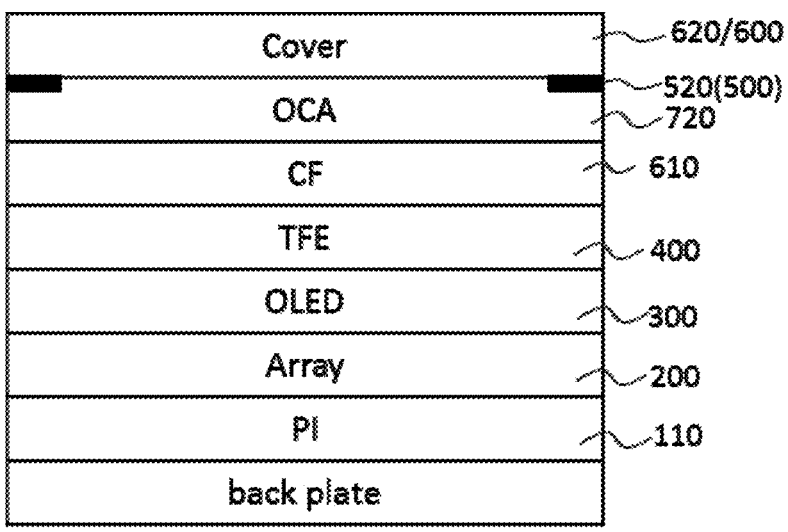
FIG. 3 is a cross-sectional view taken along line B-B shown in FIG. 1.

Referring to FIG. 1 to FIG. 3. FIG. 1 is a top view of a display panel provided by an embodiment of the present disclosure, FIG. 2 is a cross-sectional view taken along line AA shown in FIG. 1, and FIG. 3 is a cross-sectional view taken along line BB shown in FIG. 1. These cross-sections are perpendicular to a plane of the display panel.

In an embodiment, the display panel 100 includes a display area AA and a non-display area NA surrounding the display area AA. It can be understood that the dashed box in FIG. 1 indicates the boundary between the display area AA and the non-display area NA. The display area AA is an area of the display panel for displaying images, and a plurality of pixel units arranged in an array (as shown by the multiple small rectangles in the display area AA in the figure) are provided in the display area AA. Each pixel unit includes a corresponding light emitting device (for example, diode), and a control element (for example, a thin film transistor that constitutes a pixel driving circuit). The non-display area NA surrounds the display area AA, and peripheral driving components, peripheral wires, and a fan-out region are provided in the non-display area NA.

The display panel 100 includes a substrate 110, an array layer 200, a display layer 300, and an encapsulation layer 400 arranged in sequence. It can be understood that the substrate 110, the array layer 200, and the display layer 300 form a basic structure of the display panel, and the substrate 110, the array layer 200 and the encapsulation layer 400 envelope the display layer 300 in a closed space. In the embodiments of the present disclosure, a panel formed by the substrate 110, the array layer 200, the display layer 300, and the encapsulation layer 400 is defined as a basic display panel.

Figure 4:
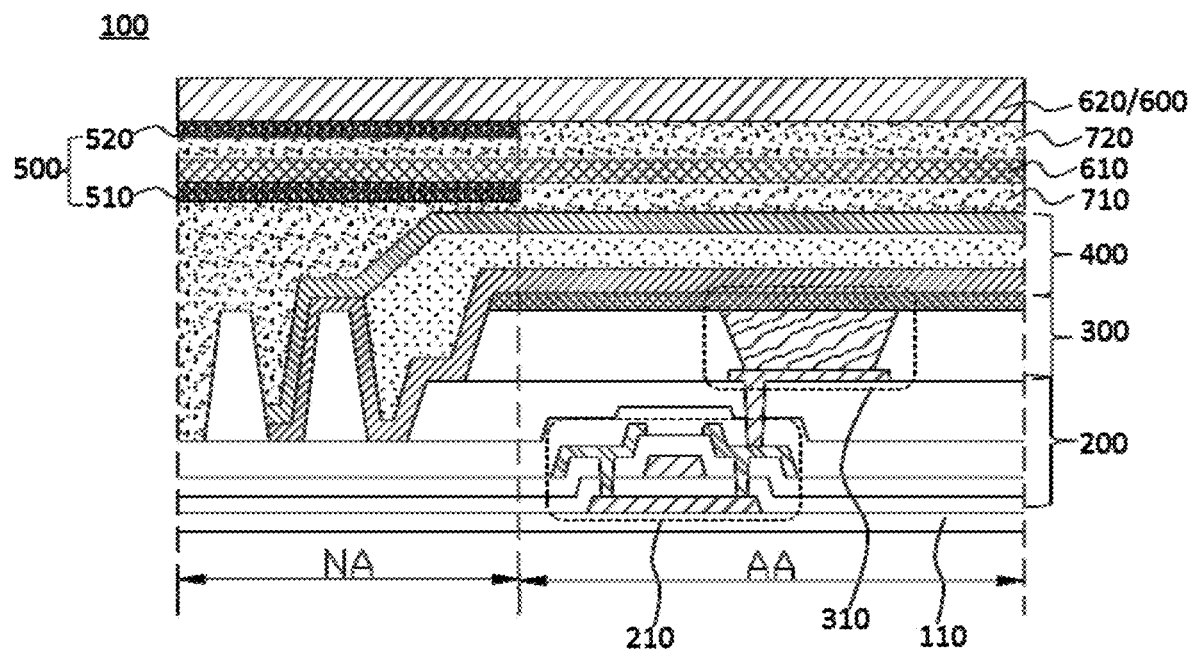
FIG. 4 is a partial cross-sectional view of the display panel shown in FIG. 1.

The composition of the basic display panel in the present disclosure is now introduced in detail in the present embodiment with reference to FIG. 4 in conjunction with other drawings. FIG. 4 is a partial cross-sectional view of the display panel in FIG. 1.

The display panel 100 includes a substrate 110. The substrate 110 (i.e., the base substrate) can be flexible, and thus is stretchable, foldable, bendable or rollable, and the flexible display panel can be stretchable, foldable, bendable or rollable. The substrate 110 can be made of any suitable insulating and flexible material. The substrate 110 is configured to block oxygen and moisture and prevent moisture or impurities from diffusing through the flexible substrate, and has a flat surface on an upper surface of the flexible substrate. For example, the substrate 110 can be made of polyimide (PI), polycarbonate (PC), polyethersulfone (PES), polyethylene terephthalate (PET), polyethylene naphthalate (PEN), polyarylate (PAR), glass fiber reinforced plastic (FRP), or other polymer materials. The substrate 110 can be transparent, translucent or opaque. In an embodiment, the display panel can further include a buffer layer (not shown in the figure) on the substrate 110, and the buffer layer can cover the entire upper surface of the substrate.

In an embodiment, a back plate film is further provided under the substrate 110 to protect a lower surface of the display panel.

The array layer 200 is located on the substrate 110, and is located at a side of the substrate 110 facing towards a display surface or a touch surface of the display panel 100. The array layer 200 can include a plurality of thin film transistors (TFT) 210, and a pixel circuit is formed by at least one thin film transistor and is configured to control the light-emitting components located in the display layer.

The embodiment of the present disclosure uses top-gate thin film transistors as an example for structural description. The thin film transistor layer 210 includes an active layer on the substrate 110, a gate insulating layer located on the active layer, a gate electrode located on the gate insulating layer, an interlayer insulating layer located on the gate electrode, and a source electrode and a drain electrode that are located on the interlayer insulating layer. The active layer can be made of an amorphous silicon material, a polysilicon material, a metal oxide material, or the like. In the case where the active layer is made of a polysilicon material, it can be formed by low-temperature amorphous silicon technology, that is, the amorphous silicon material is melted by laser to form a polysilicon material. In addition, methods such as rapid thermal annealing (RTA), solid phase crystallization (SPC), excimer laser annealing (ELA), metal induced crystallization (MIC), metal induced lateral crystallization (MILC), or continuous lateral solidification (SLS) can also be adopted. The active layer further includes a source region and a drain region formed by doping N-type impurity ions or P-type impurity ions, and a channel region located between the source region and the drain region.

The gate insulating layer includes a single inorganic layer or multiple inorganic layers made of silicon oxide or silicon nitride.

The gate electrode can include a single Layer or multiple layers of gold (Au), silver (Ag), copper (Cu), nickel (Ni), platinum (Pt), palladium (Pd), aluminum (Al), molybdenum (MO), or chromium (Cr), or an alloy such as aluminum (Al): neodymium (Nd) alloy and molybdenum (MO): tungsten (W) alloy.

The interlayer insulating layer can be formed by an inorganic insulating layer of silicon oxide, silicon nitride or the like. In other embodiments of the present disclosure, the interlayer insulating layer can be formed of an organic insulating material.

The source electrode and the drain electrode are respectively electrically connected (or coupled) to the source region and the drain region through contact holes, which are formed by selectively removing the gate insulating layer and the interlayer insulating layer.

The array layer 200 can further include a passivation layer. In an embodiment, the passivation layer is located on the source electrode and the drain electrode of the thin film transistors. The passivation layer can be made of an inorganic material such as silicon oxide or silicon nitride, or can be made of an organic material.

The array layer 200 can further include a planarization layer. In an embodiment, the planarization layer is located on the passivation layer. The planarization layer includes organic materials such as acrylic, polyimide (PI) or benzocyclobutene (BCB). The planarization layer has a planarization effect and can provide a flat bearing surface for the light-emitting layer formed thereon.

The display layer 300 is located on a side of the array layer 200 facing away from the substrate 110. The display layer 300 includes a light emitting component. In an embodiment, the display layer 300 is located on the planarization layer. The display layer 300 includes an anode layer, an organic light-emitting material, and a cathode layer that are arranged in sequence in a direction facing away from the substrate 110. The display layer 300 further includes a pixel definition layer on a side of the anode layer facing away from the array layer 200. The pixel defining layer can be made of an organic material such as polyimide (PI), polyamide, benzocyclobutene (BCB), acrylic resin, or phenolic resin, or an inorganic material such as SiNx.

In an embodiment, the anode layer includes a plurality of anode patterns corresponding to the plurality of pixels in one-to-one correspondence, and the anode patterns in the anode layer are connected to the source electrode or the drain electrode of the thin film transistors 210 through via holes located of the planarization layer. The pixel definition layer includes a plurality of apertures exposing the anode layer, and the pixel definition layer covers the edges of the anode layer patterns. The organic light-emitting material is at least partially filled in the apertures of the pixel definition layer and is in contact with the anode layer.

In an embodiment, the anode layer, the organic light-emitting material, and the cathode layer that are defined by each aperture of the pixel definition layer for the light-emitting component 310, and light-emitting components 310 can emit light of different colors depending on different organic light-emitting material. Each light-emitting component 310 forms a pixel (in other words, each light-emitting component and a pixel circuit that controls the light-emitting component form a pixel), and multiple pixels display an image.

In an embodiment, the organic light-emitting material can be formed in the apertures of the pixel definition layer using methods such as inkjet printing, nozzle printing, or evaporation. The cathode layer can be formed on the layer of the organic light-emitting material by evaporation. In an embodiment, the cathode layer can also cover the entire surface of the organic light-emitting material 320 and the pixel definition layer.

In an embodiment, the display panel 100 further includes an encapsulation layer 400 located on the display layer 300 and completely covering the display layer 300 to seal the display layer 300. It is understandable that some "on" mentioned in the embodiments can be understood as being "on the side facing away from the substrate".

In an embodiment, the encapsulation layer 400 is a thin-film encapsulation layer located on the cathode layer, and includes a first inorganic encapsulation layer, a first organic encapsulation layer, and a second inorganic encapsulation layer in that order along a direction facing away from the substrate 110. In other embodiments of the present disclosure, the encapsulation layer can include any number of stacked organic materials and inorganic materials as required, but at least one layer of organic material and at least one layer of inorganic material are deposited alternately, and the lowermost layer and the uppermost layer are made of inorganic materials.

Continuing to refer to FIG. 1 to FIG. 4, the display panel 100 further includes an ink layer 500 located in the non-display area NA and surrounding the display area AA.

The ink layer 500 includes at least a first ink layer 510 and a second ink layer 520 that are located in different layers. That is, the ink layer 500 includes at least two ink sub-layers, such as the first ink layer 510 and the second ink layer 520.

The orthographic projection of the first ink layer 510 on the substrate 110 is a non-closed pattern surrounding the display area AA, and the orthographic projection of the second ink layer 520 on the substrate 110 is a non-closed pattern surrounding the display area AA. The patterns of the ink sub-layers can be different from each other.

Furthermore, the ink layer 500 as a whole is a ring-shaped closed pattern. In other words, the orthographic projections of the first ink layer 510 and the second ink layer 520 on the substrate 110 together form a closed pattern surrounding the display area AA. That is, the orthographic projections of the first ink layer 510 and the second ink layer 520 on the substrate 110 constitute a closed ring-shaped pattern as a whole.

In an embodiment, the ink layer 500 completely covers the non-display area NA. That is to say, the orthographic projection of the ink layer 500 on the substrate 110 completely coincides with the non-display area AA.

In an embodiment, the ink layer 500 is made by screen printing. For example, the first ink layer 510 and the second ink layer 520 are respectively formed by screen printing. This can make the manufacturing process simpler, and the combination of the silk printing process with the design of the non-closed ink sub-layers of the present disclosure does not need additional etching or multiple coatings, it just requires stopping printing where the pattern is terminated.

It should be noted that, in this embodiment, the two ink sub-layers (the first ink layer and the second ink layer) surrounding to form a closed projection pattern are taken as an example for description. Of course, the number of ink sub-layers is not limited in the present disclosure. In other embodiments of the present disclosure, three, five or any number of non-closed ring-shaped ink sub-layers can jointly form a closed ring-shaped ink layer surrounding the display area.

Through this embodiment, the ink layer in the non-display area can play a role in shielding light, preventing light from leaking from the non-display area, and improving the display effect; the ink layer is arranged in a closed ring composed of multiple ink sub-layers, and each ink sub-layer has a non-closed ring shape, which can achieve a good light shielding effect while enabling the ink layer to release stress through the non-closed ink sub-layers. Moreover, because of the ink layer, the hardness of the bezel region can be increased to prevent warping of the edge of the display panel.

In an embodiment, the ink layer 500 is located outside the basic display panel, that is, at least in the layer on the encapsulation layer 400, avoiding the ink layer 500 from affecting the basic display panel, especially the display layer in the display panel.

Further, in some embodiments of the present disclosure, the display panel further includes at least one of a touch layer located or a color filter layer, the at least one of a touch layer located or a color filter layer is located on a side of the encapsulation layer facing away from the substrate, and at least part of the ink layer is located on the surface of the touch layer or the color filter layer.

For example, the functional layers (a first functional layer 610 and a second functional layer 620) in FIG. 4 can be the touch layer or the color filter layer.

Because the manufacturing process of the ink layer may include a high-temperature process, in this embodiment, the ink layer is not directly formed on the encapsulation layer. The forming of the ink layer on the touch layer or the color filter layer can prevent the forming of the ink layer from causing losses to the encapsulation layer and the display device encapsulated by the encapsulation layer.

Figure 5:
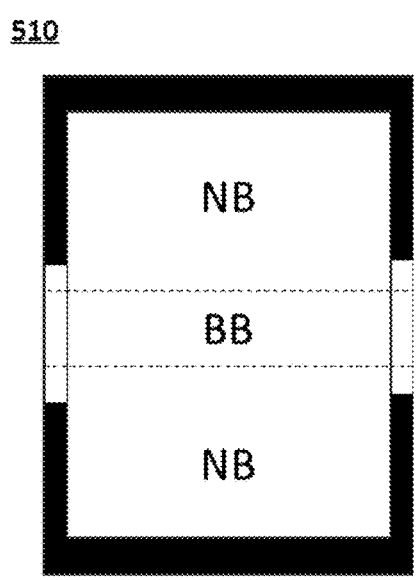
FIG. 5 is a top view of a first ink layer of a display panel provided by an embodiment of the present disclosure.
Figure 6:
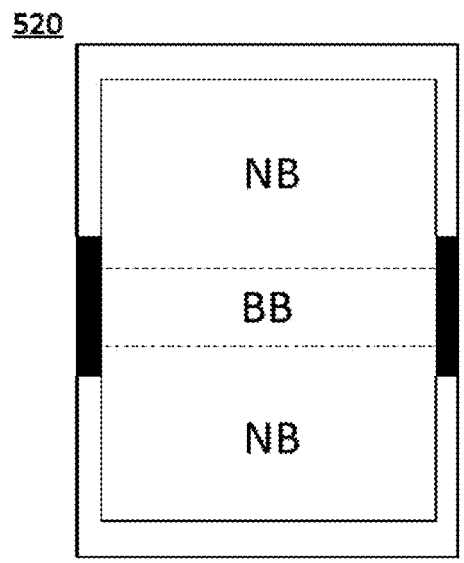
FIG. 6 is a top view of a second ink layer of a display panel provided by an embodiment of the present disclosure.

In some optional embodiments of the present disclosure, the display panel 100 is a flexible display panel or a display panel that can be bent in certain regions. Please continue to refer to FIG. 1 to FIG. 4 in combination with FIG. 5 and FIG. 6. FIG. 5 is a top view of a first ink layer of a display panel provided by an embodiment of the present disclosure, and FIG. 6 is a top view of a second ink layer of a display panel provided by an embodiment of the present disclosure. The display panel includes a bending region BB and non-bending regions NB located on both sides of the bending region BB.

It is understandable that although this embodiment only illustrates one bending region of the display panel, it does not mean that the number and direction of the bending region of the display panel are limited by the embodiment of the present disclosure. In this embodiment, three, five or any number of bending regions can be provided. In order to make the drawing clear and concise, they are not all illustrated, and only one bending region of them is illustrated.

In an embodiment, the bending region BB is a strip-shaped region located on the plane of the display panel and traverses the display panel. The bending region BB can have a bending axis Z, and the bending axis Z can be understood as a bending path or bending line of the bending region BB, or as an axis about which the bending region BB of the display panel is bent.

In an embodiment, the first ink layer 510 is located in the non-bending region NB, and the second ink layer 520 is located in the bending region BB.

In an embodiment, the orthographic projections of the first ink layer and the second ink layer on the substrate are at least partially overlapped with each other, which can prevent leaking of light at the junction of the first ink layer and the second ink layer due to stretching or dislocating of the ink layer during bending. For example, the cross-sectional view shown in FIG. 4 is just taken at an overlapping region between the first ink layer and the second ink layer.

In other embodiments of the present disclosure, the region with the first ink layer can be separated from the region with the second ink layer by the boundaries between the bending region and the non-bending region. That is to say, the first ink layer and the second ink layer are connected at boundaries thereof, and the orthographic projections of the first ink layer and the second ink layer on the substrate do not overlap each other in a large area, and the boundary of each of the first ink layer and the second ink layer ends at the junction of the bending region and the non-bending region. In this way, a situation that a step generated at ends of the first and second ink layers where the ink layers overlap are too complicated, which causes stress concentration, is avoided.

In an embodiment, a junction of the orthographic projections of the first ink layer 510 and the second ink layer 520 on the substrate 110 is located in the non-bending region NB. In this way, the junction can avoid the bending region, and light leakage at the junction of the first ink layer and the second ink layer due to stretching and dislocation of the ink layers during bending is therefore avoided.

Through the embodiments, the ink layers as a whole surround the display area and form a closed annular pattern which correspondingly shields the non-display area, and the ink layers are therefore prevented from breaking due bending of the display panel. Forming each ink sub-layer of the ink layer into a non-closed pattern is beneficial to the release of bending stress. At the same time, the ink sub-layer in the bending region is arranged in a different layer from the ink sub-layer in the non-bending region, to distribute the stress in different layers, therefore avoiding a situation of excessive stress on the layer in which both the sub-layers are arranged.

Figure 7:
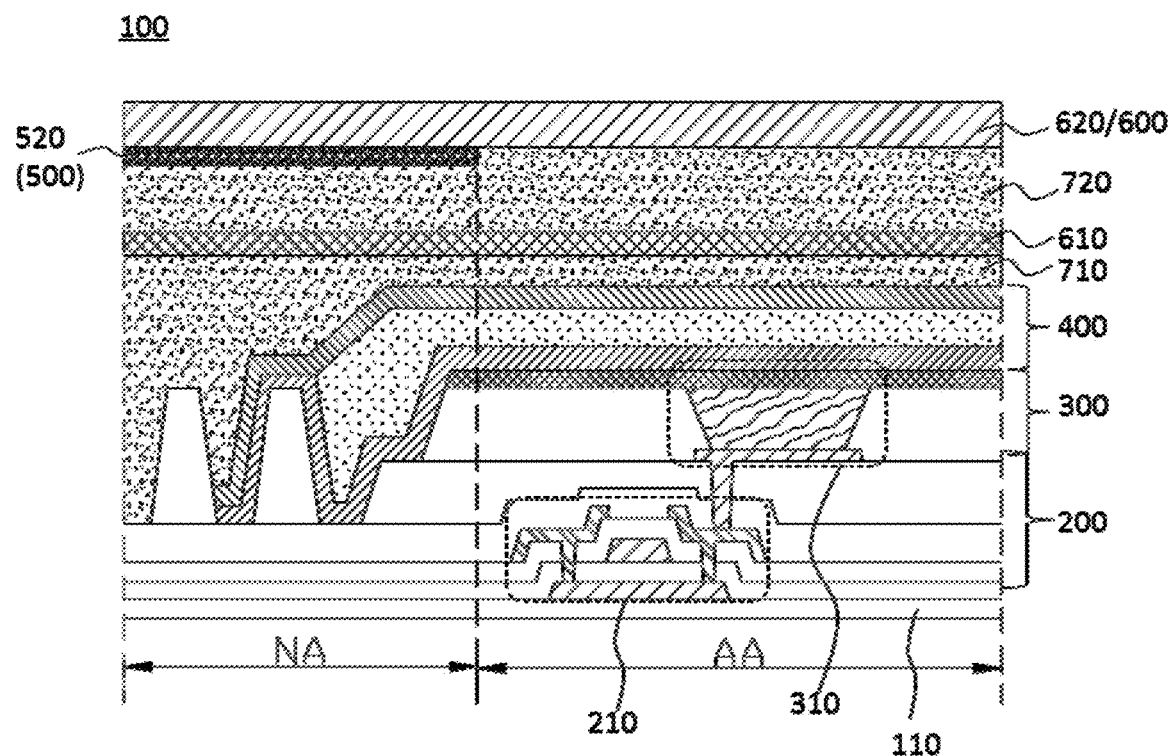
FIG. 7 is another cross-sectional view taken along the line A-A shown in FIG. 1.
Figure 8:
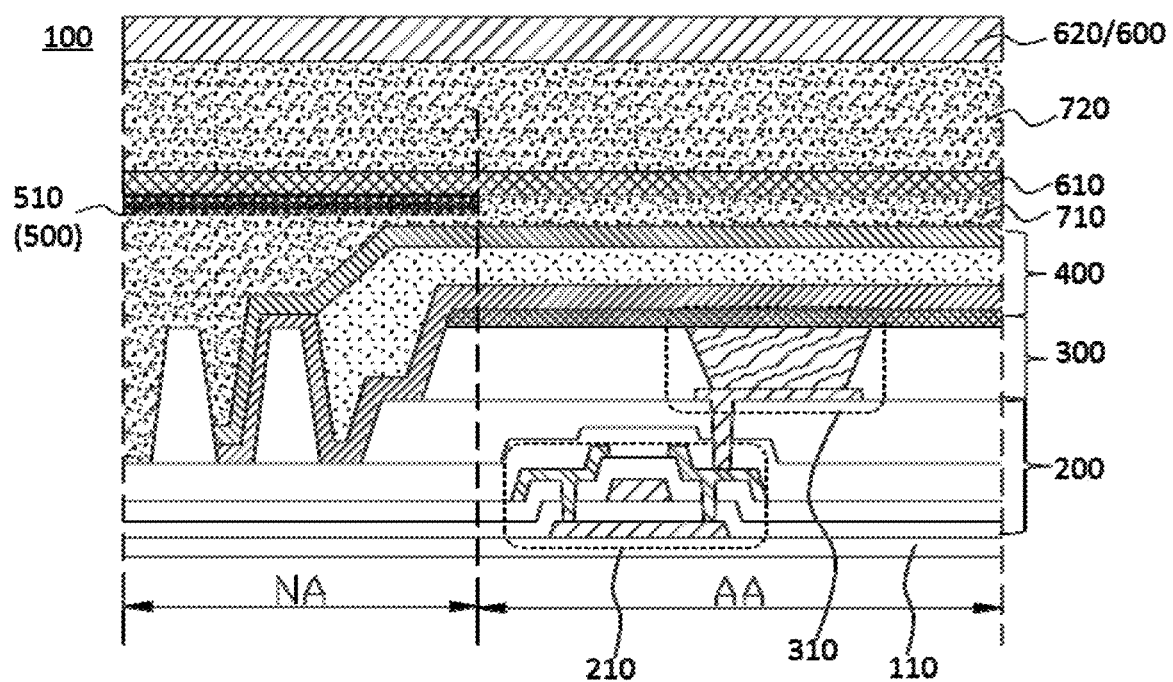
FIG. 8 is another cross-sectional view taken along the line B-B shown in FIG. 1.

FIG. 7 and FIG. 8 illustrates some embodiments of the present disclosure, where FIG. 7 is another cross-sectional view taken along line AA shown in FIG. 1, FIG. 8 is another cross-sectional view taken along line BB shown in FIG. 1, and both the cross-section in FIG. 7 and the cross-section in FIG. 8 are perpendicular to the plane of the display panel. The similar features between these embodiments and the foregoing embodiments will not be described again herein.

Referring to FIG. 1, FIG. 7 and FIG. 8, the display panel 100 further includes other functional layers on the basic display panel, such as a cover layer 600. The second ink layer 520 is located on a side adjacent to the cover layer 600. That is, the second ink layer 520 is located in a layer adjacent to the cover layer 600.

The display panel 100 further includes a first functional layer 610 located on a side of the encapsulation layer 400 facing away from the substrate 110 and a second functional layer 620 located on a side of the first functional layer 610 facing away from the encapsulation layer 400.

In an embodiment, the first functional layer 610 is one or more layers selected from a color filter substrate (CF), a touch functional layer (TP), and a polarizer (POL). The second functional layer 620 is the cover layer 600 (cover film). In an embodiment, the cover layer is a window or a glass cover.

It should be noted that the first functional layer 610 and the second functional layer 620 are usually out-cell layers, which are manufactured separately or purchased from a supplier and then bonded to the basic display panel. Therefore, an adhesive layer, which can be a transparent optical adhesive, namely OCA (also referred to as "optically clear adhesive"), can be provided on at least one side of the first functional layer 610 and the second functional layer 620.

However, since the first functional layer 610 is a layer that is required to assist in complicated tasks such as optical adjustment, the adhesive layer on the first functional layer 610 cannot be made thick for optical performance or electrical performance considerations. For example, a functional film such as CF and the adhesive attached thereon generally are made together, that is, the OCA to which the functional layer is attached is made with the functional layer as a carrier substrate. These optical functional films are limited by the process, and the thickness of the OCA on them affects the yield (that is, the optical performance). Therefore, the OCA on the adjacent CF side is relatively thin. However, the smaller the OCA thickness, the worse the coupling performance (the coupling performance of the adhesive layer mentioned here will be described in detail later). Therefore, in an embodiment, the ink layer in the bending region is arranged on a side adjacent to the cover layer.

In an embodiment, a first adhesive layer 710 is provided on a side of the first functional layer 610 facing towards the encapsulation 400, and a second adhesive layer 720 is provided on a side of the second functional layer 620 facing towards the first functional layer 610.

In an embodiment, the first adhesive layer 710 has a thickness of 15-25 μm, and the second adhesive layer 720 has a thickness of 50-90 μm. The thicknesses mentioned herein are sizes of the adhesive layers in the direction perpendicular to the display panel.

In an embodiment, the second ink layer 520 is located between the cover 600 and the second adhesive layer 720, which facilitates the second adhesive layer 720 to cover the steps formed at the edge of the second ink layer 520 and can allow the second ink layer 520 to directly contact the second adhesive layer 720 to better alleviate the bending stress of the second ink layer 520.

The coupling of the adhesive layer mentioned here is explained below. When the functional layers are arranged on the basic display panel, the coupling of the adhesive layer can enable the above-mentioned functional layers maintain their respective planes neutral when they are bent. That is to say, each functional layer will not be subjected to compression stress due to bending, or tensile stress due to bending. Layers adjacent to the adhesive layer can be better coupled to each other, and the coupling performance increases as the thickness of the adhesive increases.

Through these embodiments, a specially designed ink layer is provided for the bending region to reduce the risk of stress during bending while satisfying the aforementioned technical effects. By arranging the second ink layer in the bending region on the cover layer with a thicker adhesive layer, the yield of other functional layers will not be influenced, and the bending stress of the second ink layer can be alleviated by the second adhesive layer. In this way, damages such as cracks after the second ink layer is bent are avoided, while the second adhesive layer flattens the steps formed by the second ink layer and covers the second ink layer to reduce a total thickness space occupied by the ink sub-layers arranged in different layers.

Figure 9:
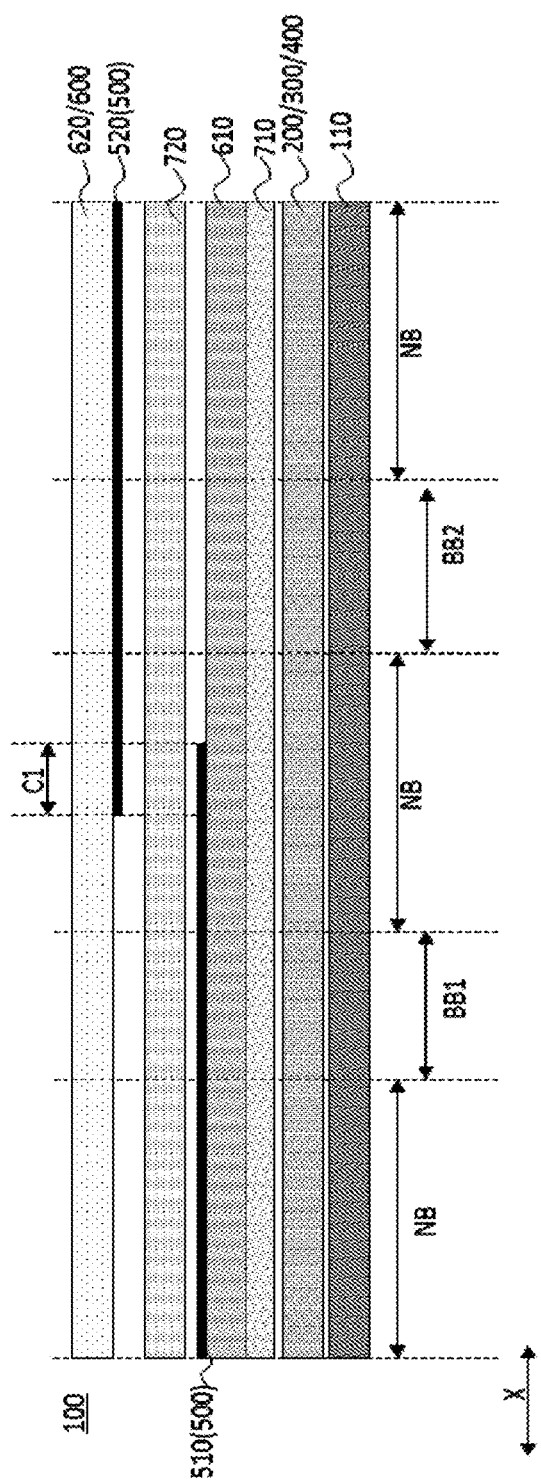
FIG. 9 is a cross-sectional view of a bezel extending along a direction perpendicular to the bending axis of the display panel in FIG. 1.
Figure 10:
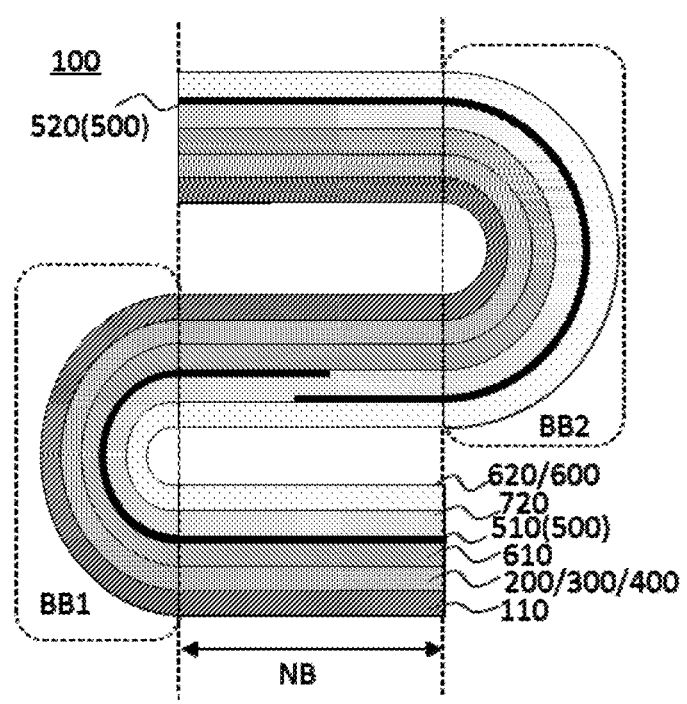
FIG. 10 is a schematic diagram of the display panel having the cross section shown in FIG. 9 in a bent state.

Please continue to refer to FIG. 1 in combination with FIG. 9 and FIG. 10. FIG. 9 is a schematic cross-sectional view of the bezel of the display panel in FIG. 1 extending along the direction perpendicular to the bending axis, and the cross-section is parallel to the annular path of the ink layer, i.e., a section taken along the dashed line S in FIG. 1. FIG. 10 is a schematic diagram of the cross-section shown in FIG. 9 when the display panel is bent. In this embodiment, the internal structure of the display panel is the same as in the above embodiments and will not be described again. It should be noted that, for the convenience of viewing in the present disclosure, for example, gaps are reserved between the layers in FIG. 9, which does not mean that other layers must be provided between two layers.

In an embodiment, the display panel includes at least two bending regions BB, and a non-bending region NB between the two bending regions BB. In an embodiment, the display panel 100 includes a plurality of bending regions BB and non-bending regions NB between the bending regions BB. That is, along the first direction X, the bending regions BB and the non-bending regions NB are arranged alternately.

The bending regions BB include a first bending region BB1 and a second bending region BB2, and a bending direction of the first bending region BB1 is different from a bending direction of the second bending region BB2. For example, the display panel includes two opposite sides, and the bending axes of the first bending region BB1 and the second bending region BB2 are respectively located on different sides of the display panel. Therefore, when the first bending region BB1 and the second bending region BB2 are respectively bent about the bending axes, one of the first bending region BB1 and the second bending region BB2 is bent to allow the display surface of the region to be located on a concave side of the display panel, and the other one of the first bending region BB1 and the second bending region BB2 is bent to allow the display surface of the region to be located on a convex side of the display panel.

The first ink layer 510 is at least partially located in the first bending region BB1. In an embodiment, the first ink layer 510 further extends to the non-bending regions NB adjacent to the first bending BB1 region, that is, the first ink layer is only located in the bending region and the non-bending region that are bent in a same bending direction as the first bending region. The first ink layer is not located in a region bent in a bending direction opposite to the bending direction of the first bending region. In some embodiments, the first ink layer is only located in the first bending region.

The second ink layer 520 is at least partially located in the second bending region BB2. In an embodiment, the second ink layer further extends to the non-bending regions adjacent to the second bending region, that is, the second ink layer is only located in the bending region and non-bending region that are bent in a same bending direction as the second bending region. The second ink layer is not located in a region bent in a bending direction opposite to the bending direction of the second bending region. In some embodiments, the second ink layer is only located in the second bending region.

In the embodiment, according to different bending directions of the bending regions, the ink sub-layers in different layers are arranged corresponding to the different bending regions to avoid the case where the same ink sub-layer is subjected to stress in different directions at the same time, which causes difficulties in releasing or alleviating stress at both ends or both sides of the ink layer.

In an embodiment, the display panel 100 includes at least one adhesive layer. In an embodiment, the adhesive layer is an optically clear adhesive (OCA). Through this design, the adhesive layer (refer to the above description of coupling) can be used to alleviate the bending difference of the ink sub-layers located in different bending regions.

In an embodiment, in a bent state, at least one of the first ink layer 510 or the second ink layer 520 is located on a concave surface of the functional layer that carries the ink sub-layer. That is to say, the ink sub-layer is made by using the functional layer that will be subsequently attached to the basic display panel as a substrate, and is formed on the functional layer by screen printing. Then the ink sub-layer and the functional layer where it is attached are bonded to the basic display panel through the adhesive layer.

It should be noted that the functional layer mentioned here refers to a non-adhesive layer. That is, the adhesive layer is not included in the functional layers mentioned in the embodiments of the present disclosure.

Through this embodiment, it is possible to allow the ink layers in different bending regions to be subjected to only compression stress during bending, to prevent the ink layers from breaking due to tensile force.

In an embodiment, the first ink layer 510 and the second ink layer 520 are located on two opposite surfaces of the adhesive layer, respectively. A first functional layer 610 is located on the side of the first ink layer 510 facing away from the adhesive layer, and a second functional layer 620 is located on the side of the second ink layer 520 facing away from the adhesive layer is.

In a bent state, the first ink layer 510 is located on a concave surface of the first functional layer 610, and the second ink layer 520 is located on a concave surface of the second functional layer 620.

In an embodiment, the display panel 100 further includes a first functional layer 610 located on a side of the encapsulation layer 400 facing away from the substrate 110, and a second functional layer 620 located on a side of the first functional layer 610 facing away from the encapsulation layer 400. The similarities of the first functional layer 610 and the second functional layer 620 with the foregoing embodiment will not be repeated herein.

A second adhesive layer 720 is also provided between the first functional layer 610 and the second functional layer 620. The first ink layer 510 and the second ink layer 520 are located on two sides of the second adhesive layer 720, respectively.

Through the embodiment, according to different bending conditions, the ink sub-layers are attached to different functional layers, and the adhesive layer (for example, the second adhesive layer 720) is used to prevent impact on the ink layers during bending without adding other buffer layers. In addition, light leakage is avoided in a case where a large number of layers are located between the first ink layer 510 and the second ink layer 520, resulting in a large vertical distance between the ink sub-layers.

Figure 11:
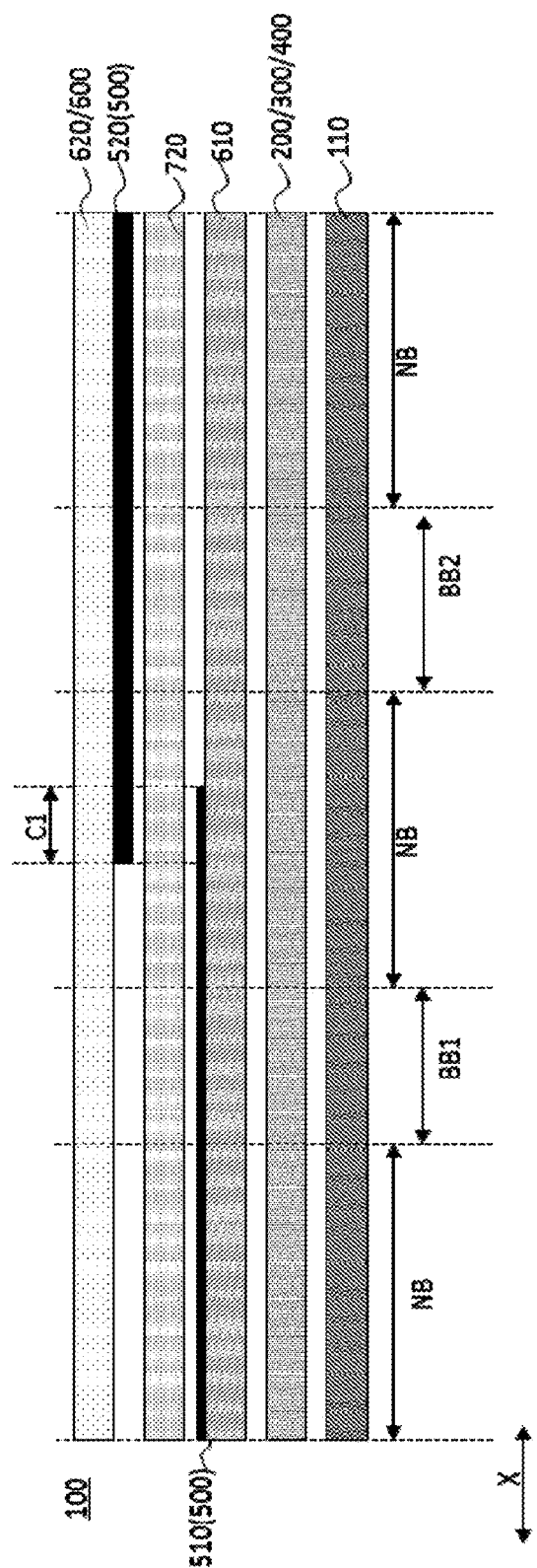
FIG. 11 is another schematic cross-sectional view of the bezel extending along the direction perpendicular to the bending axis of the display panel shown in FIG. 1.
Figure 12:
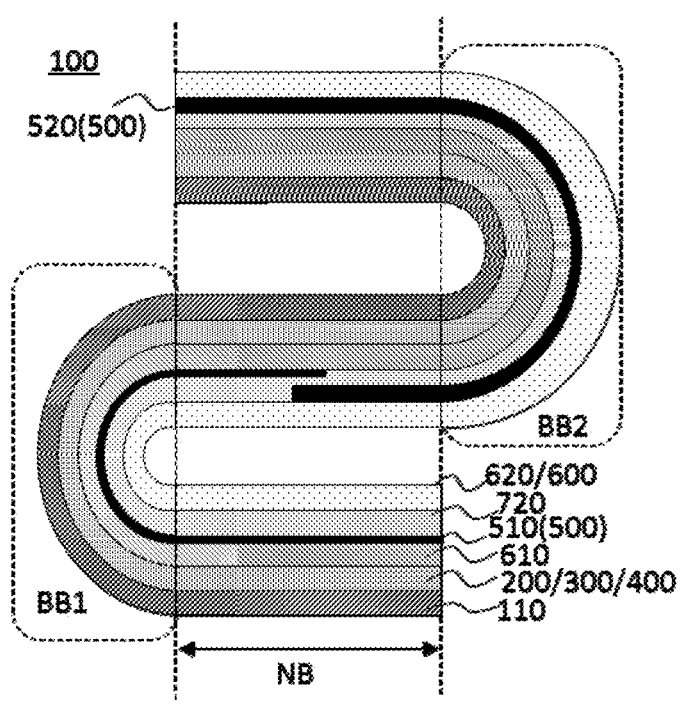
FIG. 12 is a schematic cross-sectional view of the display panel shown in FIG. 11 in a bent state.

In some embodiments of the present disclosure, as shown in FIG. 11 and FIG. 12, FIG. 11 is a schematic cross-sectional view of a bezel extending along a direction perpendicular to the bending axis of the display panel in FIG. 1, and the cross-section is parallel to the annular path of the ink layer at this position, i.e., a cross-section taken along the dashed line S in FIG. 1. FIG. 12 is a schematic diagram of the cross section shown in FIG. 11 when the display panel is in a bent state. It should be noted that, for the convenience of viewing in the present disclosure, for example, gaps are illustrated between the layers drawn in FIG. 11, however it does not mean that other layers must be provided between two layers. In this embodiment, similarities of the internal structure of the display panel with the forgoing embodiments will not be repeated herein.

In an embodiment, the first functional layer 610 is a polarizer, and the second functional layer 620 is a cover layer.

In an embodiment, the first bending region BB1 is bent in an inward bending direction, that is, after bending, two parts of the display surface of the display panel 100 in the region face each other, and the display surface faces inwards; and the cover layer 620 is located on the concave surface of the display panel 100 in the region.

The second bending region BB2 is bent in an outward bending direction, that is, opposite to the inward bending direction. After bending, the display surface faces outwards, and the cover layer 620 is located on the convex surface of the display panel 100 in the region.

In an embodiment, a thickness of the first ink layer 610 is smaller than a thickness of the second ink layer 620.

Due to problems such as the tension of the cover layer, a bending radius of an inner bend is different from a bending radius of an outward bend, and the bending radius of the outward bend is larger than the bending radius of the inward bend. In other words, the inward bend is formed more easily and is bent to a greater degree, with a greater curvature and a smaller radius of curvature. A compression stress applied to the first ink layer 610 in the bending region of the inward bend (i.e., the first bending region BB1) is greater than a compression stress applied to the second ink layer 620 in the bending region of the outward bend (i.e., the second bending region BB2). In other words, once the first bending region BB1 is bent under force, it is more prone to be bent to a greater extent.

Therefore, through this embodiment, in order to prevent the ink layer from wrinkling due to a greater compressive stress subjected when bent with a small radius, the ink sub-layer in an inwards-bent region has a different thickness from the ink sub-layer in an outwards-bent region. That is, the thickness of the first ink layer 610 is less than the thickness of the second ink layer 620, so the first ink layer in the inwards-bent region can be prevented from wrinkling. Since the first ink layer 610 has a smaller thickness, it is less likely to generate a large stress, and therefore less likely to form wrinkles. Even if the degree of bending is large, it is less likely to break or wrinkle, and has no adverse influence on the adjacent layers. A specially designed ink layer can be set for the bending region to reduce the risk of stress during bending.

In addition, combined with the above analysis, by arranging the second ink layer in the bending region on the cover layer attached with a thicker adhesive layer, it will not affect the yield of other functional layers, the second adhesive layer relieves the bending stress of the second ink layer, avoiding damage such as cracks of the second ink layer after bent, and meanwhile the second adhesive layer flattens the steps formed by the second ink layer and covers the second ink layer to reduce the total thickness space occupied by the ink sub-layers arranged in different layers.

Figure 13:
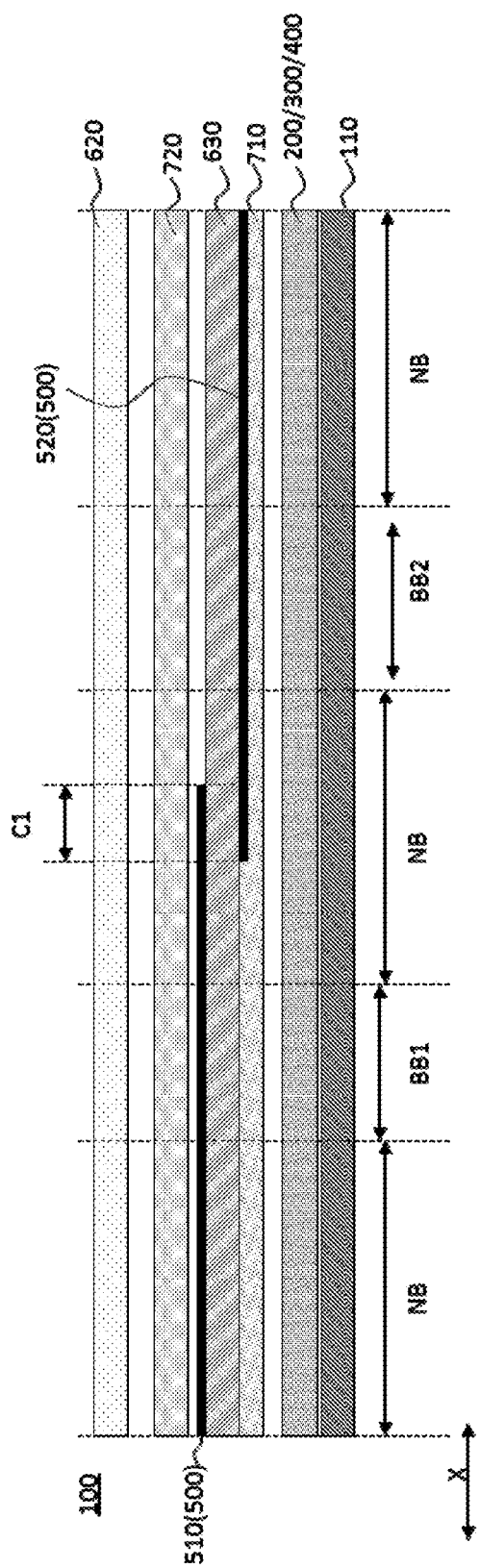
FIG. 13 is a schematic cross-sectional view of another bezel extending along the direction perpendicular to the bending axis of the display panel in FIG. 1.

In some optional embodiments of the present disclosure, as shown in FIG. 13, FIG. 13 is another schematic cross-sectional view of the bezel extending along the direction perpendicular to the bending axis of the display panel in FIG. 1, and the cross-section is parallel to the annular path of the ink layer at the position, i.e., being a cross-section taken along the dashed line S shown in FIG. 1. The similar features between this embodiment and the foregoing embodiments will not be explained again herein. It should be noted that, for the convenience of viewing in the present disclosure, gaps are reserved between the layers in FIG. 13, which does not mean that other layers must be provided between two layers.

The difference is that the display panel 100 can include a third functional layer 630, and similarities of the third functional layer 630 with the above-mentioned first functional layer 610 will not be repeated herein.

The first ink layer 510 and the second ink layer 520 are located on two opposite surfaces of the third functional layer 630, respectively. That is, the first ink layer 510 and the second ink layer 520 are adjacent to two sides of the third functional layer, respectively.

In an embodiment, the first ink layer 510 and the second ink layer 520 are formed or attached on surfaces of the third functional layer 630, respectively.

In an embodiment, the third functional layer 630 is a polarizer.

In an embodiment, the third functional layer 630 is not an outermost functional layer of the display panel. The second adhesive layer 720 and the second functional layer 620 are sequentially disposed on a side of the third functional layer 630 facing away from the first adhesive layer 710.

Through this embodiment, firstly, the first ink layer 510 and the second ink layer 520 located in different bending regions are respectively disposed on the surfaces on different sides of the third functional layer, enabling that the ink layer in each region is subjected to compression stress. Secondly, since adhesive layers are provided on both sides of the third functional layer, the upper neutral surface of the third functional layer is stable and the bending stress is controllable, and therefore arranging the ink sub-layers on both sides of the third functional layer improves the bending reliability. In addition, arranging the first ink layer 510 and the second ink layer 520 respectively on two sides of the same functional layer can avoid light leakage caused by a case where a large number of layers is provided between the first ink layer 510 and the second ink layer 520 and results in a large vertical distance between the ink sub-layers. In addition, the third functional layer 630 (polarizer) has a small strain when being bent, so the overlapping region C1 of the two ink sub-layers can be reduced to a printing tolerance range.

In other embodiments of the present disclosure, two ink sub-layers can also be printed simultaneously on the two sides of the second functional layer 620 (that is, the cover film). Further, in order to avoid friction damage to the outer ink sub-layer, the surface of the ink sub-layer needs to be covered with a protective film.

Figure 14:
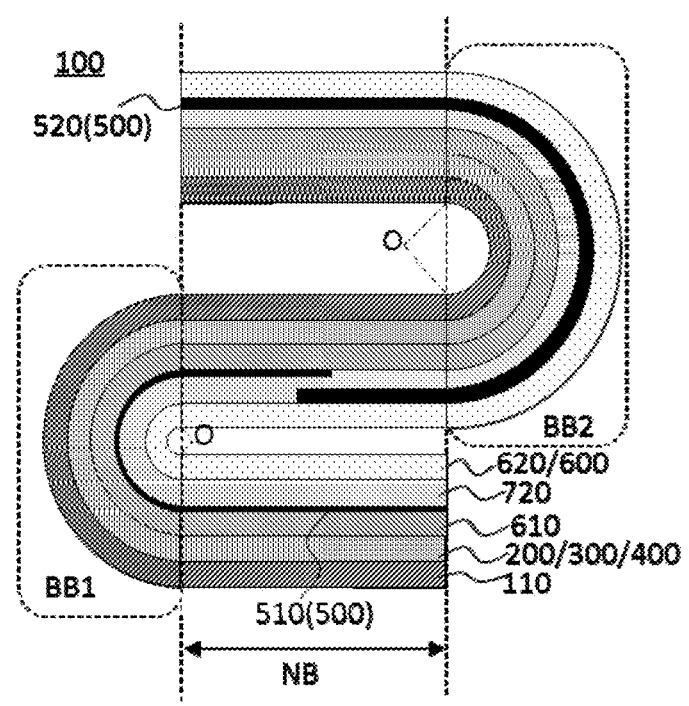
FIG. 14 is another cross-sectional view of the display panel in FIG. 1 in a bent state taken along the dashed line S in FIG. 1.

As shown in FIG. 14, FIG. 14 is another cross-sectional view of the display panel in a bending state in FIG. 1 taken along the dashed line S in FIG. 1. The similarities between this embodiment and the foregoing embodiments will not be repeated.

In an embodiment, the bending radius of the first bending region BB1 is smaller than the bending radius of the second bending region BB2. To facilitate understanding, centers O corresponding to the bending radii are illustrated in FIG. 14.

The first ink layer 510 is at least partially located in the first bending region BB1, the second ink layer 520 is at least partially located in the second bending region BB2, and the thickness of the first ink layer 510 is smaller than the thickness of the second ink layer 520.

Through this embodiment, in order to prevent the ink layers from wrinkling due to greater compression stress subjected when bent with a small radius, the ink sub-layer in the inwards-bent region and the ink sub-layer in the outwards-bent region are set to have different thicknesses, that is, the thickness of the first ink layer 610 is less than the thickness of the second ink layer 620, so the first ink layer in the inwards-bent region can be prevented from wrinkling. Since the first ink layer 610 has a smaller thickness, it is less likely to generate large stress, and less likely to form wrinkles. Even if the degree of bending is large, it is less likely to break or wrinkle, and will not affect the adjacent layers.

Figure 15:
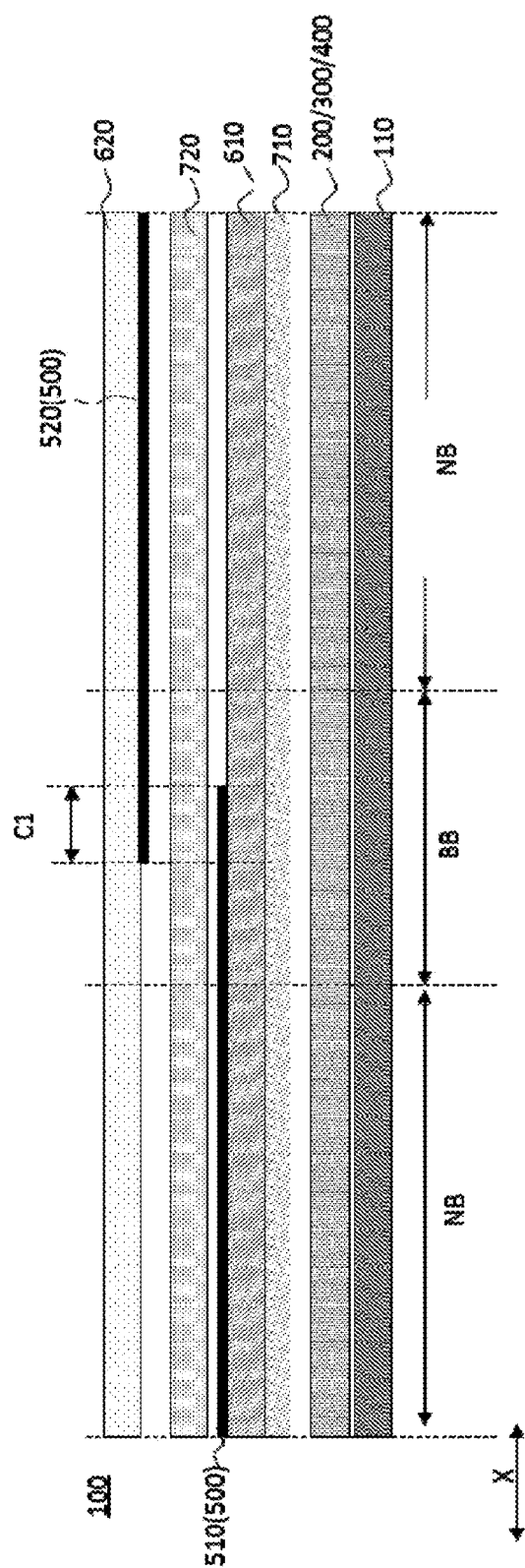
FIG. 15 is still another schematic cross-sectional view of the bezel extending along the direction perpendicular to the bending axis of the display panel shown in FIG. 1.

In other embodiments of the present disclosure, as shown in FIG. 15, FIG. 15 is another schematic cross-sectional view of the bezel extending along the direction perpendicular to the bending axis of the display panel in FIG. 1, and the cross-section is parallel to the annular path of the ink layer at the position, i.e., the cross-section taken along the dashed line S in FIG. 1. The similarities between this embodiment and the foregoing embodiments will not be repeated. It should be noted that, for the convenience of viewing in the present disclosure, gaps are reserved between the layers in FIG. 15 when drawing, which does not mean that other layers must be provided between any two of these layers.

The similarities between this embodiment and the forgoing embodiments will not be repeated. The difference is that the display panel includes at least one bending region BB and non-bending regions NB located on both sides of each of the at least one bending region BB.

The junction of the orthographic projections of the first ink layer 510 and the second ink layer 520 on the substrate 110 is located in the bending region BB.

Through this embodiment, the junction of the first ink layer and the second ink layer can be regarded as a discontinuous position of the entire ink layer, that is to say, the ink layer has a disconnected section at the junction of the ink sub-layers; The junction of the first ink layer and the second ink layer is arranged in the bending region, i.e., the preset disconnected section of the ink layer is arranged in the bending region. After the display panel is bent, the bending region is subjected to greater stress and is stretched to a greater extent. The degree is also greater. Because the preset disconnected section is set in the bending region and the ink layer is not continuous in the bending region, even if the ink layer shrinks or moves due to bending, the ink sub-layers can move or deform through the disconnected section directly arranged in the bending region, releasing stress more easily and improving bending reliability.

Figure 16:
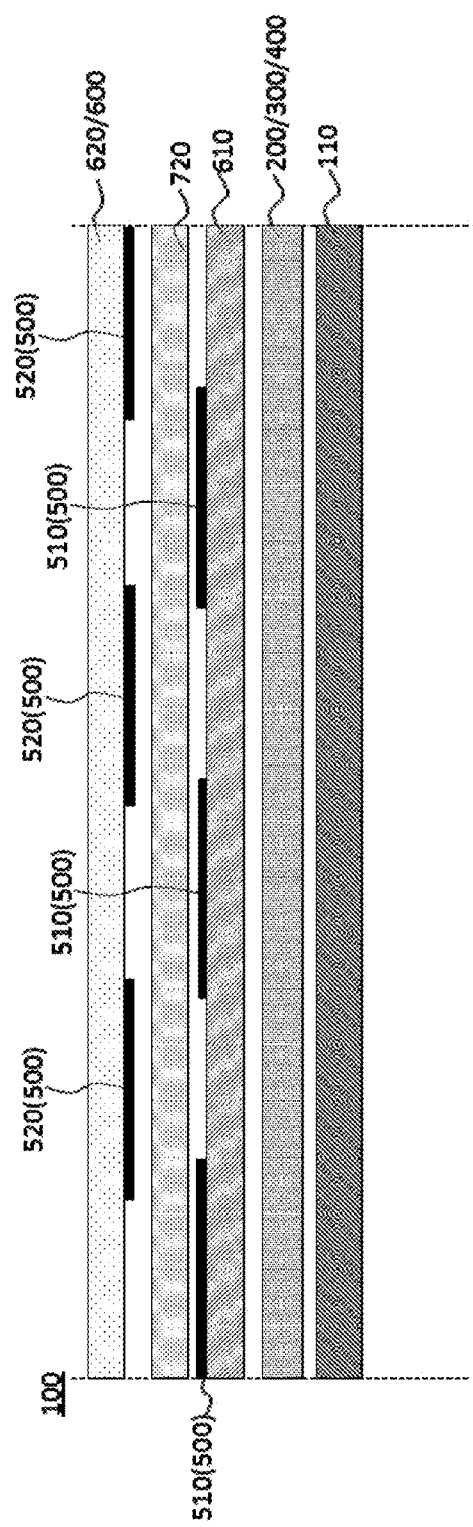
FIG. 16 is still another schematic cross-sectional view of the bezel extending along the direction perpendicular to the bending axis of the display panel shown in FIG. 1.

In other embodiments of the present disclosure, as shown in FIG. 16, FIG. 16 is another schematic cross-sectional view of the bezel extending along the direction perpendicular to the bending axis of the display panel in FIG. 1, and the cross-section is parallel to the annular path of the ink layer at the position, i.e., a cross-section taken along the dashed line S in FIG. 1. The similarities between this embodiment and the foregoing embodiments will not be repeated. It should be noted that, for the convenience of viewing in the present disclosure, gaps are reserved between the layers in FIG. 16, which does not mean that other layers must be provided between these layers.

The similarities between this embodiment and the foregoing embodiments will not be repeated here. The difference is that the display panel is a bending display panel, and along a direction parallel to the plane of the display panel and perpendicular to the bending axis, the first ink layer and the second ink layer are alternately arranged. That is, along the dashed line S in FIG. 1, the first ink layer 510 includes a plurality of sub-segments, and the plurality of sub-segments is sequentially spaced from one another along the dashed line S. Similarly, along the dashed line S in FIG. 1, the second ink layer 520 includes a plurality of sub-segments, and the plurality of sub-segments is sequentially spaced from one another along the dashed line S. Along the dashed line S in FIG. 1, the orthographic projection of the first ink layer 510 on the substrate 110 and the orthographic projection of the second ink layer 520 on the substrate 110 alternate.

Through this embodiment, the ink sub-layers are arranged alternately in different layers, and the ink sub-layer in each layer is set in a dashed, intermittent state, which can prevent a certain layer from being overstressed at the interface level due to the addition of the ink layer, being conducive to stress release while avoiding cracks extending along the ink layer.

Figure 17:
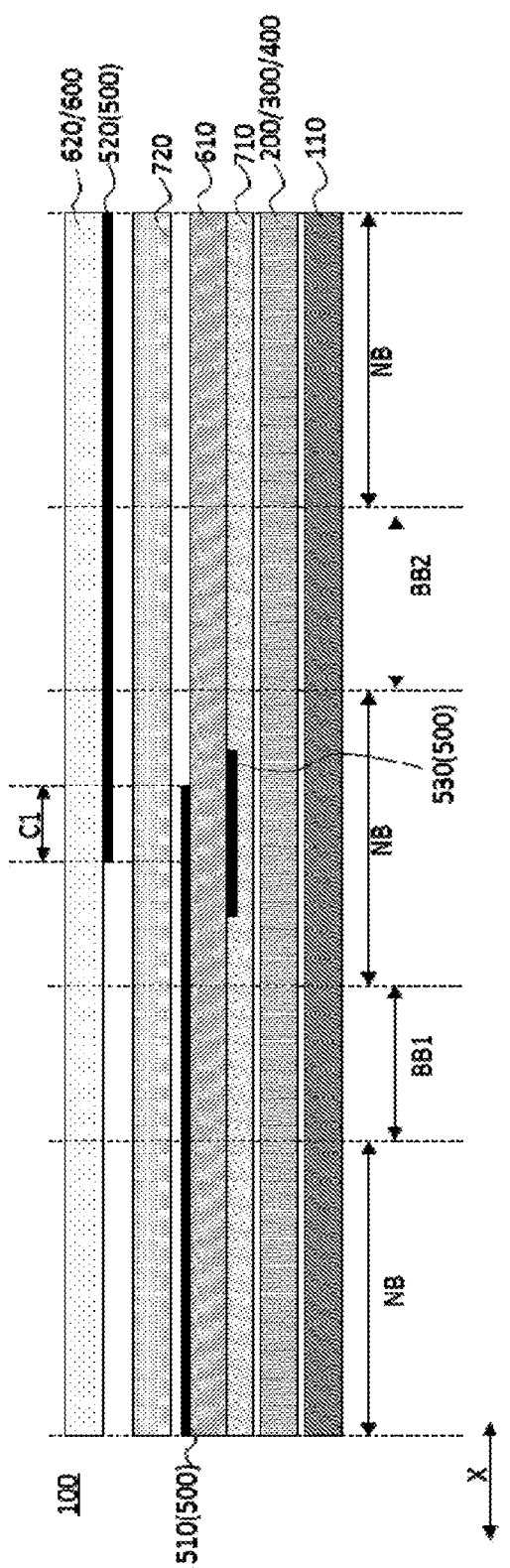
FIG. 17 is still another schematic cross-sectional view of the bezel extending along a direction perpendicular to the bending axis of the display panel shown in FIG. 1.

In other optional embodiments of the present disclosure, as shown in FIG. 17, FIG. 17 is another schematic cross-sectional view of the bezel extending along the direction perpendicular to the bending axis of the display panel in FIG. 1, and the cross-section is parallel to the annular path of the ink layer at the position, that is, the cross-section is taken along the dashed line S in FIG. 1. The similarities between this embodiment and the foregoing embodiment will not be repeated. It should be noted that, for the convenience of viewing in the present disclosure, gaps are reserved between the layers in FIG. 17, which does not mean that other layers must be provided between these layers.

Differently from the forgoing embodiments, the ink layer 500 further includes a third ink layer 530. The junction of the orthographic projections of the first ink layer 510 and the second ink layer 520 on the substrate 110 overlaps the orthographic projection of the third ink layer 530 on the substrate 110.

In an embodiment, the junction of the first ink layer 510 and the second ink layer 520 is located in the non-bending region NB, and the third ink layer 530 is located in the non-bending region NB. In this way, the problem of increased bending stress caused by a case where a region where a large number of ink sub-layers in different layers overlap with each other is in the bending region.

Through this embodiment, the third ink layer is added for reinforcement, which can avoid the light leakage caused by the gap between the first ink layer and the second ink layer appearing after the relative displacement between the first ink layer and the second ink layer caused by bending, improving the bending reliability of the ink layer.

With reference to any of the forgoing embodiments and the accompanying drawings, the display panel is a bending display panel, and along the direction parallel to the plane of the display panel and perpendicular to the bending axis, the first ink layer and the second ink layer overlap with each other with an overlapping length greater than or equal to 0.3 mm. That is, the length Cl of the overlapping region of the first ink layer 510 and the second ink layer 520 in the extending direction of the ink layer 500 is greater than or equal to 0.3 mm.

At least the following dislocations will cause position deviation of the first ink layer 510 and the second ink layer 520: bonding deviation (about 50 μm-100 μm), process deviation during formation of the ink layer, and deviation caused by dislocation of the layers of the display panel after being bent. These are three main factors. It is understandable that, unless otherwise specified, the overlap or junction of two spaced layers in the present disclosure refers to the overlap or junction of the orthographic projections of the two layers on the substrate. It should be noted that the extending direction of the ink layer here is the annular path of the annular ink layer. For example, the ink layer is a ring surrounding the display area or has a shape that exactly corresponds to the non-display area, and the extending direction of the ink layer at a certain position is the extending direction of the edge of the display area or the bezel adjacent to the position.

Through this embodiment, the deviation of the ink layer caused by other processes can be compensated by arranging the ink layer in different layers while ensuring that the ink layer will not break after bending, further avoiding the light leakage of the ink layer and improving the bending reliability of the ink layer.

Figure 18:
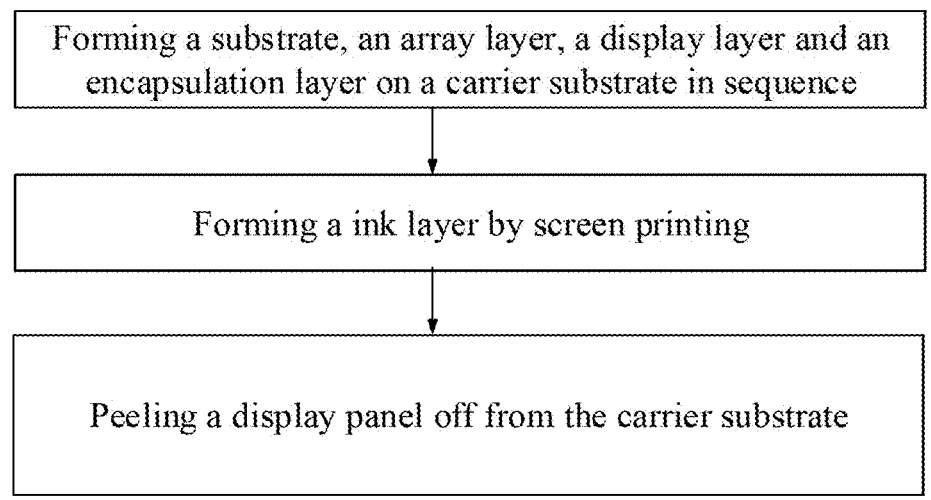
FIG. 18 is a flow chart for manufacturing a display panel provided by an embodiment of the present disclosure.

The present disclosure also provides a manufacturing method of any of the above-mentioned display panels, as shown in FIG. 18, which is a flow chart for manufacturing a display panel provided by an embodiment of the present disclosure.

The manufacturing method of the display panel of the embodiment of the present disclosure includes sequentially arranging a substrate, an array layer, a display layer, and an encapsulation layer on a carrier substrate. In an embodiment, the carrier substrate is a glass substrate.

The ink layer may be formed by silk printing. In an embodiment, the first ink layer and the second ink layer are respectively formed by silk printing after the encapsulation layer is manufactured. In an embodiment, after the encapsulation layer is manufactured, the method further includes bonding the functional layer. After the ink layer is formed on the functional layer by silk printing, the functional layer is then bonded to the basic display panel.

The substrate (and the layers on the substrate) may be peeled off from the carrier substrate by laser. That is, the step of peeling the display panel off from the carrier substrate is performed at least after the ink layer is formed.

Through this embodiment, the ink layer can increase the hardness of the bezel region while avoiding light leakage in the non-display area. When the flexible substrate is removed from the carrier substrate, the edge of the display panel can be prevented from being warped, and the non-closed ring design of the ink sub-layer can release the stress in the bezel region during anti-warping of the ink layer.

Figure 19:
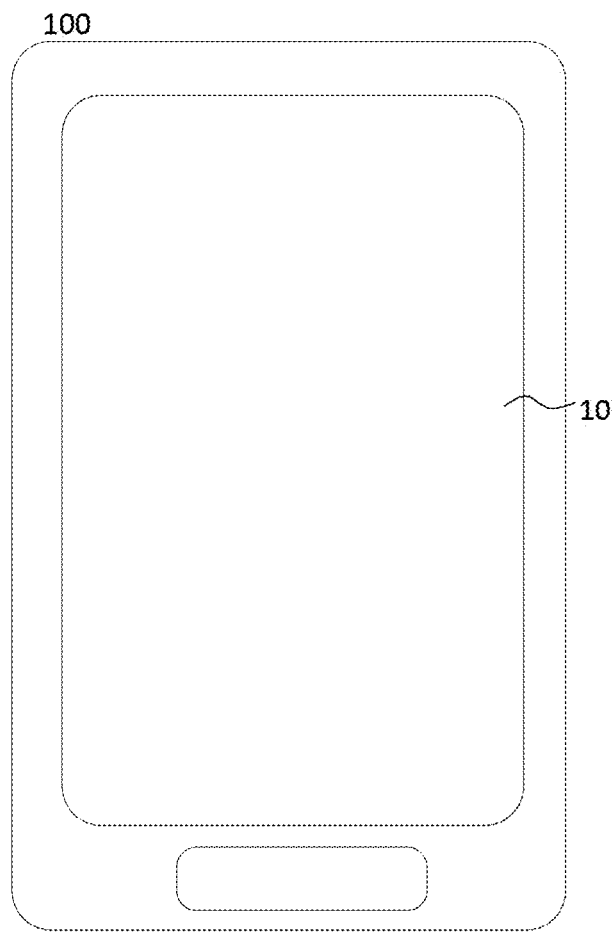
FIG. 19 is a schematic diagram of a display device provided by an embodiment of the present disclosure.

The present disclosure also provides a display device including the display panel provided by the present disclosure. FIG. 19 is a schematic diagram of a display device provided by an embodiment of the present disclosure. The display device 1000 includes the display panel 100 provided in any of the above-mentioned embodiments of the present disclosure. The embodiment of FIG. 19 uses a mobile phone as an example to describe the display device 1000. It is understandable that the display device provided by the embodiment of the present disclosure can be a computer, a television, a vehicle-mounted display device, or other display devices with display functions, which is not limited herein. The display device provided by the embodiment of the present disclosure has the beneficial effects of the display panel provided by the embodiment of the present disclosure. For details, reference can be made to the specific description of the display panel in the foregoing embodiments, and details are not repeated here.

The above content is a further detailed description of the present disclosure in conjunction with specific preferred embodiments, and it cannot be considered that the specific implementation of the present disclosure is limited to these descriptions. For those of ordinary skill in the technical field to which the present disclosure belongs, without departing from the concept of the present disclosure, deductions or substitutions can be made, which should be regarded as belonging to the protection scope of the present disclosure.

What is claimed is:

1. A display panel having a display area and a non-display area surrounding the display area, wherein the display panel comprises:
   a substrate;
   an array layer;
   a display layer;
   an encapsulation layer; and
   an ink layer located in the non-display area and surrounding the display area,
   wherein the substrate, the array layer, the display layer and the encapsulation layer are arranged sequentially, and
   wherein the ink layer comprises a first ink layer and a second ink layer located in a layer different from the first ink layer, wherein an orthographic projection of the first ink layer on the substrate is a non-closed pattern surrounding the display area, and wherein an orthographic projection of the second ink layer on the substrate is a non-closed pattern surrounding the display area.

2. The display panel according to claim 1, wherein the display panel has a bending region and non-bending regions located at both sides of the bending region, and wherein the first ink layer is located in the non-bending regions, and the second ink layer is located in the bending region.

3. The display panel according to claim 1, further comprising:
a cover layer, wherein the second ink layer is located in a layer adjacent to the cover layer.

4. The display panel according to claim 3, wherein the display panel has a bending region, the bending region comprises a first bending region and a second bending region that are bended towards different bending directions, the first ink layer is at least partially located in the first bending region, and the second ink layer is at least partially located in the second bending region.

5. The display panel according to claim 4, further comprises:
at last one adhesive layer.

6. The display panel according to claim 5, further comprising:
a functional layer carrying at least one of the first ink layer or the second ink layer, wherein in a bent state, the at least one of the first ink layer or the second ink layer is located on a concave surface of the functional layer.

7. The display panel according to claim 6, wherein the first ink layer and the second ink layer are located on two opposite surfaces of one of the at least one adhesive layer, respectively,
the functional layer comprises a first functional layer provided on a side of the first ink layer facing away from the one of the at least one adhesive layer, and a second functional layer provided on a side of the second ink layer facing away from the one of the at least one adhesive layer, and
in the bent state, the first ink layer is located on a concave surface of the first functional layer, and the second ink layer is located on a concave surface of the second functional layer.

8. The display panel according to claim 7, wherein the first functional layer is a polarizer, and the second functional layer is the cover layer.

9. The display panel according to claim 8, wherein the first ink layer has a thickness smaller than a thickness of the second ink layer.

10. The display panel according to claim 6, wherein the functional layer comprises a third functional layer, wherein the first ink layer and the second ink layer are located on two opposite sides of the third functional layer, respectively.

11. The display panel according to claim 1, wherein the display panel has a first bending region and a second bending region, and wherein the first bending region has a bending radius smaller than a bending radius of the second bending region, and
wherein the first ink layer is at least partially located in the first bending region, the second ink layer is at least partially located in the second bending region, and the first ink layer has a thickness smaller than a thickness of the second ink layer.

12. The display panel according to claim 1, wherein the display panel has at least one bending region and non-bending regions located at both sides of each of the at least one bending region, and
wherein a junction of the orthographic projections of the first ink layer and the second ink layer on the substrate is located in the at least one bending region.

13. The display panel according to claim 1, wherein the display panel is a bendable display panel, and the first ink layer and the second ink layer are alternately arranged along a direction parallel to a plane of the display panel and perpendicular to a bending axis of the display panel.

14. The display panel according to claim 1, wherein the ink layer further comprises a third ink layer, and a junction of the orthographic projections of the first ink layer and the second ink layer on the substrate overlaps with an orthographic projection of the third ink layer on the substrate.

15. The display panel according to claim 1, wherein the display panel is a bendable display panel, the first ink layer and the second ink layer overlap with each other with an overlapping length greater than or equal to 0.3 mm along a direction parallel to a plane of the display panel and perpendicular to a bending axis of the display panel.

16. The display panel according to claim 1, further comprising at least one of a touch layer and a color filter layer located at a side of the encapsulation layer facing away from the substrate, wherein the ink layer is at least partially located in a layer adjacent to the at least one of the touch layer or the color filter layer.

17. The display panel according to claim 1, wherein the ink layer is formed by screen printing.

18. A display device comprising a display panel having a display area and a non-display area surrounding the display area, wherein display panel comprises:
a substrate;
an array layer;
a display layer;
an encapsulation layer; and
an ink layer located in the non-display area and surrounding the display area,
wherein the substrate, the array layer, the display layer and the encapsulation layer are arranged sequentially, wherein the ink layer comprises a first ink layer and a second ink layers located in a layer different from the first ink layer, wherein an orthographic projection of the first ink layer on the substrate is a non-closed pattern surrounding the display area, and wherein an orthographic projection of the second ink layer on the substrate is a non-closed pattern surrounding the display area.

19. A manufacturing method of a display panel, wherein the display panel has a display area and a non-display area surrounding the display area, and wherein the display panel comprises:
a substrate;
an array layer;
a display layer;
an encapsulation layer; and
an ink layer located in the non-display area and surrounding the display area, wherein the substrate, the array layer, the display layer and the encapsulation layer are arranged sequentially, wherein the ink layer comprises a first ink layer and a second ink layer located in a layer different from the first ink layer, wherein an orthographic projection of the first ink layer on the substrate is a non-closed pattern surrounding the display area, and wherein an orthographic projection of the second ink layer on the substrate is a non-closed pattern surrounding the display area;
wherein the manufacturing method comprises:
arranging the substrate, the array layer, the display layer and the encapsulation layer in sequence; and
forming the ink layer by screen printing.

20. The manufacturing method according to claim 19, further comprising:
forming the substrate on a carrier substrate, and peeling the display panel off from the carrier substrate after said forming the ink layer.

\* \* \* \* \*